United States Patent
Rizzo et al.

(10) Patent No.: US 7,129,098 B2
(45) Date of Patent: Oct. 31, 2006

(54) REDUCED POWER MAGNETORESISTIVE RANDOM ACCESS MEMORY ELEMENTS

(75) Inventors: Nicholas D. Rizzo, Gilbert, AZ (US);
Renu W. Dave, Chandler, AZ (US);
Bradley N. Engel, Chandler, AZ (US);
Jason A. Janesky, Gilbert, AZ (US);
JiJun Sun, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 105 days.

(21) Appl. No.: 10/997,118

(22) Filed: Nov. 24, 2004

(65) Prior Publication Data

US 2006/0108620 A1 May 25, 2006

(51) Int. Cl.
*H01L 21/00* (2006.01)

(52) U.S. Cl. .............................. 438/3; 365/33; 365/158; 365/173; 365/225.5

(58) Field of Classification Search ............... 438/3; 365/33, 158, 173, 225.5
See application file for complete search history.

(56) References Cited

U.S. PATENT DOCUMENTS

| | | | |
|---|---|---|---|
| 3,163,853 A | 12/1964 | Belson | |
| 3,448,438 A | 6/1969 | Hansen et al. | |
| 3,573,760 A | 4/1971 | Chang et al. | |
| 3,638,199 A | 1/1972 | Kolankowsky et al. | |
| 3,707,706 A | 12/1972 | Kefalas | |
| 3,913,080 A | 10/1975 | Leo et al. | |
| 4,103,315 A | 7/1978 | Hempstead et al. | |
| 4,351,712 A | 9/1982 | Cuomo et al. | |
| 4,356,523 A | 10/1982 | Yeh | |
| 4,455,626 A | 6/1984 | Lutes | |
| 4,556,925 A | 12/1985 | Suenaga et al. | |
| 4,663,685 A | 5/1987 | Tsang | |
| 4,719,568 A | 1/1988 | Carrubba et al. | |
| 4,731,757 A | 3/1988 | Daughton et al. | |
| 4,751,677 A | 6/1988 | Daughton et al. | |
| 4,754,431 A | 6/1988 | Jenson | |
| 4,780,848 A | 10/1988 | Daughton et al. | |

(Continued)

FOREIGN PATENT DOCUMENTS

DE          43 27 458          8/1993

(Continued)

OTHER PUBLICATIONS

Engel et al., "A 4-Mbit Toggle MRAM Based on a Novel Bit and Switching Method," IEEE Transactions on Magnetism, 2004, pp. 1-5.

(Continued)

*Primary Examiner*—Ngân V. Ngô
(74) *Attorney, Agent, or Firm*—Ingrassia, Fisher &Lorenz (57) ABSTRACT

Low power magnetoresistive random access memory elements and methods for fabricating the same are provided. In one embodiment, a magnetoresistive random access device has an array of memory elements. Each element comprises a fixed magnetic portion, a tunnel barrier portion, and a free SAF structure. The array has a finite magnetic field programming window Hwin represented by the equation $H_{win} \approx (\langle Hsat \rangle - N\sigma_{sat}) - (\langle Hsw \rangle + N\sigma_{sw})$, where $\langle Hsw \rangle$ is a mean switching field for the array, $\langle Hsat \rangle$ is a mean saturation field for the array, and Hsw for each memory element is represented by the equation $H_{SW} \approx \sqrt{H_k H_{SAT}}$, where $H_k$ represents a total anisotropy and $H_{SAT}$ represents an anti-ferromagnetic coupling saturation field for the free SAF structure of each memory element. N is an integer greater than or equal to 1. $H_k$, $H_{SAT}$, and N for each memory element are selected such that the array requires current to operate that is below a predetermined current value.

14 Claims, 6 Drawing Sheets

U.S. PATENT DOCUMENTS

| | | |
|---|---|---|
| 4,825,325 A | 4/1989 | Howard |
| 4,884,235 A | 11/1989 | Thiele |
| 5,039,655 A | 8/1991 | Pisharody |
| 5,075,247 A | 12/1991 | Matthews |
| 5,159,513 A | 10/1992 | Dieny et al. |
| 5,173,873 A | 12/1992 | Wu et al. |
| 5,258,884 A | 11/1993 | Howard et al. |
| 5,268,806 A | 12/1993 | Goubau et al. |
| 5,284,701 A | 2/1994 | Hamon |
| 5,285,339 A | 2/1994 | Chen et al. |
| 5,301,079 A | 4/1994 | Cain et al. |
| 5,329,486 A | 7/1994 | Lage |
| 5,343,422 A | 8/1994 | Kung et al. |
| 5,346,302 A | 9/1994 | Ryu |
| 5,347,485 A | 9/1994 | Taguchi et al. |
| 5,348,894 A | 9/1994 | Gnade et al. |
| 5,349,302 A | 9/1994 | Cooper |
| 5,361,226 A | 11/1994 | Taguchi et al. |
| 5,375,082 A | 12/1994 | Katti et al. |
| 5,396,455 A | 3/1995 | Brady et al. |
| 5,398,200 A | 3/1995 | Mazure et al. |
| 5,408,377 A | 4/1995 | Gurney et al. |
| 5,420,819 A | 5/1995 | Pohm |
| 5,432,734 A | 7/1995 | Kawano et al. |
| 5,442,508 A | 8/1995 | Smith |
| 5,448,515 A | 9/1995 | Fukami et al. |
| 5,452,243 A | 9/1995 | Ansel et al. |
| 5,468,985 A | 11/1995 | Harima |
| 5,475,825 A | 12/1995 | Yonezawa et al. |
| 5,477,842 A | 12/1995 | Maruyama et al. |
| 5,496,759 A | 3/1996 | Yue et al. |
| 5,498,561 A | 3/1996 | Sakuma et al. |
| 5,528,440 A | 6/1996 | Fontana et al. |
| 5,534,355 A | 7/1996 | Okuno et al. |
| 5,534,793 A | 7/1996 | Nasserbakht |
| 5,541,868 A | 7/1996 | Prinz |
| 5,567,523 A | 10/1996 | Rosenblum et al. |
| 5,569,617 A | 10/1996 | Yeh et al. |
| 5,585,986 A | 12/1996 | Parkin |
| 5,587,943 A | 12/1996 | Torok et al. |
| 5,617,071 A | 4/1997 | Daughton |
| 5,636,093 A | 6/1997 | Gijs et al. |
| 5,640,343 A | 6/1997 | Gallagher et al. |
| 5,650,958 A | 7/1997 | Gallagher et al. |
| 5,659,499 A | 8/1997 | Chen et al. |
| 5,661,062 A | 8/1997 | Prinz |
| 5,673,162 A | 9/1997 | Saito |
| 5,699,293 A | 12/1997 | Tehrani et al. |
| 5,702,831 A | 12/1997 | Chen et al. |
| 5,712,612 A | 1/1998 | Lee et al. |
| 5,715,121 A | 2/1998 | Sakakima et al. |
| 5,729,410 A | 3/1998 | Fontana, Jr. et al. |
| 5,732,016 A | 3/1998 | Chen et al. |
| 5,734,605 A | 3/1998 | Zhu et al. |
| 5,745,408 A | 4/1998 | Chen et al. |
| 5,748,519 A | 5/1998 | Tehrani et al. |
| 5,757,056 A | 5/1998 | Chui |
| 5,761,110 A | 6/1998 | Irrinki et al. |
| 5,764,567 A | 6/1998 | Parkin |
| 5,766,743 A | 6/1998 | Fujikata et al. |
| 5,768,181 A | 6/1998 | Zhu et al. |
| 5,774,394 A | 6/1998 | Chen et al. |
| 5,774,404 A | 6/1998 | Eto |
| 5,786,275 A | 7/1998 | Kubo |
| 5,801,984 A | 9/1998 | Parkin |
| 5,804,250 A | 9/1998 | Yang |
| 5,804,485 A | 9/1998 | Liang |
| 5,825,685 A | 10/1998 | Yamane et al. |
| 5,828,578 A | 10/1998 | Blomgren |
| 5,831,920 A | 11/1998 | Chen et al. |
| 5,832,534 A | 11/1998 | Sing et al. |
| 5,835,314 A | 11/1998 | Moodera et al. |
| 5,838,608 A | 11/1998 | Zhu et al. |
| 5,852,574 A | 12/1998 | Naji |
| 5,856,008 A | 1/1999 | Cheong et al. |
| 5,861,328 A | 1/1999 | Tehrani et al. |
| 5,892,708 A | 4/1999 | Pohm |
| 5,894,447 A | 4/1999 | Takashima |
| 5,898,612 A | 4/1999 | Chen et al. |
| 5,902,690 A | 5/1999 | Tracy et al. |
| 5,905,996 A | 5/1999 | Pawlowski |
| 5,907,784 A | 5/1999 | Larson |
| 5,917,749 A | 6/1999 | Chen et al. |
| 5,920,500 A | 7/1999 | Tehrani et al. |
| 5,926,414 A | 7/1999 | McDowell et al. |
| 5,930,164 A | 7/1999 | Zhu |
| 5,932,343 A | 8/1999 | Hayashi et al. |
| 5,940,319 A | 8/1999 | Durlam et al. |
| 5,943,284 A | 8/1999 | Mizuno et al. |
| 5,943,574 A | 8/1999 | Tehrani et al. |
| 5,946,227 A | 8/1999 | Naji |
| 5,946,228 A | 8/1999 | Abraham et al. |
| 5,948,553 A | 9/1999 | Kamijo |
| 5,949,622 A | 9/1999 | Kamiguchi et al. |
| 5,949,696 A | 9/1999 | Threewitt |
| 5,953,248 A | 9/1999 | Chen et al. |
| 5,955,211 A | 9/1999 | Maeda et al. |
| 5,956,267 A | 9/1999 | Hurst et al. |
| 5,959,880 A | 9/1999 | Shi et al. |
| 5,966,012 A | 10/1999 | Parkin |
| 5,966,323 A | 10/1999 | Chen et al. |
| 5,976,713 A | 11/1999 | Fuke et al. |
| 5,978,257 A | 11/1999 | Zhu et al. |
| 5,982,660 A | 11/1999 | Bhattacharyya |
| 5,985,356 A | 11/1999 | Schultz et al. |
| 5,985,365 A | 11/1999 | Jaye |
| 5,986,858 A | 11/1999 | Sato et al. |
| 5,986,925 A | 11/1999 | Naji et al. |
| 5,990,011 A | 11/1999 | McTeer |
| 5,998,040 A | 12/1999 | Nakatani et al. |
| 6,004,654 A | 12/1999 | Shinjo et al. |
| 6,005,753 A | 12/1999 | Fontana, Jr. et al. |
| 6,016,269 A | 1/2000 | Peterson et al. |
| 6,023,395 A | 2/2000 | Dill et al. |
| 6,048,739 A | 4/2000 | Hurst et al. |
| 6,052,302 A | 4/2000 | Moyer et al. |
| 6,052,303 A | 4/2000 | Chevallier et al. |
| 6,054,226 A | 4/2000 | Takeda et al. |
| 6,055,178 A | 4/2000 | Naji |
| 6,055,179 A | 4/2000 | Koganei et al. |
| 6,069,820 A | 5/2000 | Inomata et al. |
| 6,072,718 A | 6/2000 | Abraham et al. |
| 6,083,764 A | 7/2000 | Chen |
| 6,097,625 A | 8/2000 | Scheuerlein |
| 6,097,626 A | 8/2000 | Brug et al. |
| 6,111,784 A | 8/2000 | Nishimura |
| 6,114,719 A | 9/2000 | Dill et al. |
| 6,120,842 A | 9/2000 | Lu et al. |
| 6,127,045 A | 10/2000 | Gill |
| 6,134,060 A | 10/2000 | Ryat |
| 6,134,139 A | 10/2000 | Bhattacharyya et al. |
| 6,145,055 A | 11/2000 | Fujimoto |
| 6,163,477 A | 12/2000 | Tran |
| 6,165,803 A | 12/2000 | Chen et al. |
| 6,166,948 A | 12/2000 | Parkin et al. |
| 6,169,687 B1 | 1/2001 | Johnson |
| 6,169,689 B1 | 1/2001 | Naji |
| 6,172,903 B1 | 1/2001 | Nishimura |
| 6,175,475 B1 | 1/2001 | Lin et al. |
| 6,175,515 B1 | 1/2001 | Peczalski et al. |
| 6,178,074 B1 | 1/2001 | Gill |
| 6,178,112 B1 | 1/2001 | Bessho et al. |
| 6,180,444 B1 | 1/2001 | Gates et al. |
| 6,185,143 B1 | 2/2001 | Perner et al. |

| | | | | | | |
|---|---|---|---|---|---|---|
| 6,188,549 | B1 | 2/2001 | Wiitala | 6,567,246 | B1 | 5/2003 | Sakakima et al. |
| 6,189,077 | B1 | 2/2001 | Robertson et al. | 6,633,498 | B1 | 10/2003 | Engel et al. |
| 6,191,972 | B1 | 2/2001 | Miura et al. | 6,674,662 | B1 | 1/2004 | Hillebrands et al. |
| 6,195,240 | B1 | 2/2001 | Gill | 6,707,083 | B1 | 3/2004 | Hiner et al. |
| 6,198,610 | B1 | 3/2001 | Kawawake et al. | 6,714,446 | B1 | 3/2004 | Engel |
| 6,205,051 | B1 | 3/2001 | Brug et al. | 2001/0026470 | A1 | 10/2001 | Gillies et al. |
| 6,205,052 | B1 | 3/2001 | Slaughter et al. | 2001/0035545 | A1 | 11/2001 | Schuster-Woldan et al. |
| 6,205,073 | B1 | 3/2001 | Naji | 2001/0050859 | A1 | 12/2001 | Siegfried |
| 6,211,090 | B1 | 4/2001 | Durlam et al. | 2002/0024780 | A1 | 2/2002 | Mao et al. |
| 6,232,777 | B1 | 5/2001 | Sato et al. | 2002/0036331 | A1 | 3/2002 | Nickel et al. |
| 6,233,172 | B1 | 5/2001 | Chen et al. | 2002/0036919 | A1 | 3/2002 | Daughton et al. |
| 6,249,406 | B1 | 6/2001 | Gill et al. | 2002/0039308 | A1 | 4/2002 | Gogl et al. |
| 6,256,247 | B1 | 7/2001 | Perner | 2002/0044396 | A1 | 4/2002 | Amano et al. |
| 6,259,586 | B1 | 7/2001 | Gill | 2002/0048185 | A1 | 4/2002 | Thewes et al. |
| 6,269,018 | B1 | 7/2001 | Monsma et al. | 2002/0058158 | A1 | 5/2002 | Odagawa et al. |
| 6,269,040 | B1 | 7/2001 | Reohr et al. | 2002/0080644 | A1 | 6/2002 | Ito |
| 6,272,040 | B1 | 8/2001 | Salter et al. | 2002/0080661 | A1 | 6/2002 | Gogl et al. |
| 6,275,363 | B1 | 8/2001 | Gill | 2002/0089024 | A1 | 7/2002 | Iwata |
| 6,277,762 | B1 | 8/2001 | Hwang | 2002/0097540 | A1 | 7/2002 | Hayashi et al. |
| 6,278,631 | B1 | 8/2001 | Naji | 2002/0097602 | A1 | 7/2002 | Lammers |
| 6,281,538 | B1 | 8/2001 | Slaughter | 2002/0154539 | A1 | 10/2002 | Swanson et al. |
| 6,285,581 | B1 | 9/2001 | Tehrani | 2002/0159203 | A1 | 10/2002 | Saito et al. |
| 6,292,336 | B1 | 9/2001 | Horng et al. | 2003/0042562 | A1 | 3/2003 | Giebler et al. |
| 6,292,389 | B1 | 9/2001 | Chen et al. | 2003/0072174 | A1 | 4/2003 | Savtchenko et al. |
| 6,295,225 | B1 | 9/2001 | Oepts | 2003/0089933 | A1 | 5/2003 | Janesky et al. |
| 6,313,973 | B1 | 11/2001 | Fuke et al. | 2004/0042315 | A1* | 3/2004 | Drewes ................... 365/223 |
| 6,314,020 | B1 | 11/2001 | Hansen et al. | 2004/0120184 | A1 | 6/2004 | Janesky et al. |
| 6,317,299 | B1 | 11/2001 | Pinarbasi | 2004/0246776 | A1* | 12/2004 | Covington ............... 365/173 |
| 6,317,376 | B1 | 11/2001 | Tran et al. | 2005/0158952 | A1* | 7/2005 | Drewes ................... 438/257 |
| 6,322,640 | B1 | 11/2001 | Xiao et al. | 2006/0013039 | A1* | 1/2006 | Braun et al. ............ 365/171 |
| 6,330,137 | B1 | 12/2001 | Knapp et al. | 2006/0023492 | A1* | 2/2006 | Min et al. .............. 365/158 |
| 6,331,943 | B1 | 12/2001 | Naji et al. | 2006/0028862 | A1* | 2/2006 | Min et al. .............. 365/158 |
| 6,331,944 | B1 | 12/2001 | Monsma et al. | 2006/0057745 | A1* | 3/2006 | Horng et al. ............ 438/3 |
| 6,338,899 | B1 | 1/2002 | Fukuzawa et al. | | | | |
| 6,341,053 | B1 | 1/2002 | Nakada et al. | | | FOREIGN PATENT DOCUMENTS | |
| 6,341,084 | B1 | 1/2002 | Numata et al. | DE | | 198 30 343 | 7/1998 |
| 6,343,032 | B1 | 1/2002 | Black et al. | EP | | 0 068 760 | 10/1985 |
| 6,344,954 | B1 | 2/2002 | Redon et al. | EP | | 0 279 537 | 12/1993 |
| 6,351,408 | B1 | 2/2002 | Schwarzl et al. | EP | | 0 613 148 | 1/1994 |
| 6,351,409 | B1 | 2/2002 | Rizzo et al. | EP | | 0 335 715 | 7/1995 |
| 6,358,756 | B1 | 3/2002 | Sandhu et al. | EP | | 0 773 551 | 5/1997 |
| 6,359,805 | B1 | 3/2002 | Hidaka | EP | | 0 936 624 | 8/1999 |
| 6,363,007 | B1 | 3/2002 | Lu et al. | EP | | 0 962 939 | 8/1999 |
| 6,366,494 | B1 | 4/2002 | Weber et al. | EP | | 0 971 424 | 1/2000 |
| 6,379,978 | B1 | 4/2002 | Goebel et al. | EP | | 0 992 984 | 4/2000 |
| 6,383,574 | B1 | 5/2002 | Han et al. | EP | | 1 061 592 | 12/2000 |
| 6,385,109 | B1 | 5/2002 | Naji | EP | | 0 768 672 | 4/2001 |
| 6,388,917 | B1 | 5/2002 | Hoffmann | EP | | 1 094 467 | 4/2001 |
| 6,389,524 | B1 | 5/2002 | Sato | EP | | 1 109 068 | 6/2001 |
| 6,392,922 | B1 | 5/2002 | Liu et al. | EP | | 1 109 170 | 6/2001 |
| 6,392,923 | B1 | 5/2002 | Naji | EP | | 0 624 868 | 8/2001 |
| 6,392,924 | B1 | 5/2002 | Liu et al. | EP | | 1 126 531 | 8/2001 |
| 6,396,735 | B1 | 5/2002 | Michijima et al. | EP | | 1 168 355 | 1/2002 |
| 6,404,674 | B1 | 6/2002 | Anthony et al. | EP | | 1 298 669 | 4/2003 |
| 6,418,046 | B1 | 7/2002 | Naji | EP | | 0 929 110 | 12/2003 |
| 6,424,562 | B1 | 7/2002 | Rosner et al. | GB | | 1 052 646 | 3/1965 |
| 6,429,497 | B1 | 8/2002 | Nickel | JP | | 01 214077 | 2/1988 |
| 6,430,084 | B1 | 8/2002 | Rizzo et al. | JP | | 02 288209 | 4/1989 |
| 6,436,526 | B1 | 8/2002 | Odagawa et al. | JP | | 06 061293 | 3/1994 |
| 6,445,612 | B1 | 9/2002 | Naji | JP | | 09 050611 | 12/1995 |
| 6,449,133 | B1 | 9/2002 | Makino et al. | JP | | 09 199769 | 1/1996 |
| 6,466,471 | B1 | 10/2002 | Bhattacharyya | JP | | 08 096328 | 4/1996 |
| 6,469,878 | B1 | 10/2002 | Mack et al. | JP | | 08 321739 | 12/1996 |
| 6,473,335 | B1 | 10/2002 | Bohm et al. | JP | | 09 306159 | 11/1997 |
| 6,475,812 | B1 | 11/2002 | Nickel et al. | JP | | 09 306733 | 11/1997 |
| 6,487,110 | B1 | 11/2002 | Nishimura et al. | JP | | 09 325746 | 12/1997 |
| 6,493,259 | B1 | 12/2002 | Swanson et al. | JP | | 10 004226 | 1/1998 |
| 6,501,144 | B1 | 12/2002 | Rizzo | JP | | 10 162326 | 6/1998 |
| 6,515,895 | B1 | 2/2003 | Naji | JP | | 10 162568 | 6/1998 |
| 6,531,723 | B1 | 3/2003 | Engel et al. | JP | | 10 270776 | 10/1998 |
| 6,538,919 | B1 | 3/2003 | Abraham et al. | JP | | 11 039858 | 2/1999 |
| 6,545,906 | B1 | 4/2003 | Savtchenko et al. | JP | | 11 316913 | 11/1999 |
| 6,556,473 | B1 | 4/2003 | Saito et al. | | | | |

| | | |
|---|---|---|
| JP | 2000 090418 | 3/2000 |
| JP | 2000 123325 | 4/2000 |
| JP | 2000 132961 | 5/2000 |
| JP | 2000 286478 | 10/2000 |
| JP | 2001 068760 | 3/2001 |
| JP | 2001 084756 | 3/2001 |
| JP | 2002 141481 | 5/2002 |
| JP | 2002 170374 | 6/2002 |
| JP | 2002 334585 | 11/2002 |
| WO | WO 93/09541 | 5/1993 |
| WO | WO 96/41379 | 12/1996 |
| WO | WO 99/18578 | 9/1998 |
| WO | WO 98/47613 | 10/1998 |
| WO | WO 00/04551 | 1/2000 |
| WO | WO 00/058970 | 10/2000 |
| WO | WO 02/41367 | 5/2002 |
| WO | WO 02/073620 | 9/2002 |

OTHER PUBLICATIONS

WORLEDGE, D.C., "Magnetic Phase Diagram of Two Identical Coupled Nanomagnets," Applied Physics Letters, vol. 84, No. 15, Apr. 12, 2004, pp. 2847-2849.

WORLEDGE, D.C., "Spin Flop Switching for Magnetic Random Access Memory," Applied Physics Letters, vol. 84, No. 22, May 31, 2004, pp. 4559-4561.

Pohm et al., "Analysis of 0.1 to 0.3 Micron Wide, Ultra Dense GMR Memory Elements," IEEE Transactions on Magnetics, Bd. 30, Nr. 6, Nov. 1994, 4650-4652.

Pohm et al., "The Architecture of a High Performance Mass Store With GMR Memory Cells," IEEE Transactions on Magnetics, Bd. 31, Nr. 6, Nov. 1995, 3200-3202.

Pohm et al., "Demagnetization Effects on Forward and Reverse Thresholds of M-R Memory Elements," Journal of Applied Physics, Bd. 69, Nr. 8, 5763-5764.

Pohm et al., The Energy and Width of Paired Neel Walls in Double Layer M-R Films, IEEE Transactions on Magnetics, Bd. 26, Nr. 5, Sep. 1990, 2831-2833.

Pohm et al., "Experimental and Analytical Properties of 0.2 Micron Wide, Multi-Layer, GMR, Memory Elements," IEEE Transactions on Magnetics, Bd. 32, Nr. 5, Sep. 1996, 4645-1647.

Pohm et. al., "Future Projections and Capabilities of GMR NV Memory," IEEE International Nonvolatile Memory Technology Conference, Jun. 24-26, 1996, 113-115.

Tehrani et al., "High Density Nonvolatile Magnetoresistive RAM," International Electron Devices Meeting, Dec. 1996, 193-196.

Comstock et al., "Perturbations to the Stoner-Wohlfarth Threshold in 2 X 20 UM M-R Memory Elements," Journal of Applied Physics, Bd. 63, Nr. 8, Apr. 15, 1988, 4321-4323.

Beech et al., "Simulation of Sub-Micron GMR Memory Cells," IEEE Transactions on Magnetics, Bd. 31, Nr. 6, Nov. 1995, 3200-3202.

Tang et al., "Spin-Valve RAM Cell," IEEE Transactions on Magnetics, Bd. 31, Nr. 6, Nov. 1995, 3206-3208.

Yoo et al., "2-Dimensional Numerical Analysis of Laminated Thin Film Elements," IEEE Transactions on Magnetics, Bd. 24, Nr. 6, Nov. 1988, 2377-2379.

Uhm et al., "Computer Simulation of Switching Characteristics in Magnetic Tunnel Junctions Exchange-Biased by Synthetic Antiferromagnets," Journal of Magnetism and Magnetic Materials, vol. 239, Issues 1-3, Feb. 2002, pp. 123-125.

* cited by examiner

REDUCED POWER MAGNETORESISTIVE RANDOM ACCESS MEMORY ELEMENTS

FIELD OF THE INVENTION

The present invention generally relates to magnetoelectronic devices, and more particularly relates to magnetoresistive random access memory elements that require lower power for operation.

BACKGROUND OF THE INVENTION

Magnetoelectronic devices, spin electronic devices, and spintronic devices are synonymous terms for devices that make use of effects predominantly caused by electron spin. Magnetoelectronics is used in numerous information devices, and provides non-volatile, reliable, radiation resistant, and high-density data storage and retrieval. The numerous magnetoelectronics information devices include, but are not limited to, Magnetoresistive Random Access Memory (MRAM), magnetic sensors, and read/write heads for disk drives.

Typically, a magnetoelectronic information device, such as an MRAM, includes an array of memory elements. Each memory element typically has a structure that includes multiple magnetic layers separated by various non-magnetic layers. Information is stored as directions of magnetization vectors in the magnetic layers. Magnetic vectors in one magnetic layer are magnetically fixed or pinned, while the magnetization direction of another magnetic layer may be free to switch between the same and opposite directions that are called "parallel" and "antiparallel" states, respectively. Corresponding to the parallel and antiparallel magnetic states, the magnetic memory element has low and high electrical resistance states, respectively. Accordingly, a detection of change in the measured resistance allows a magnetoelectronics information device, such as an MRAM device, to provide information stored in the magnetic memory element.

Figure 1:
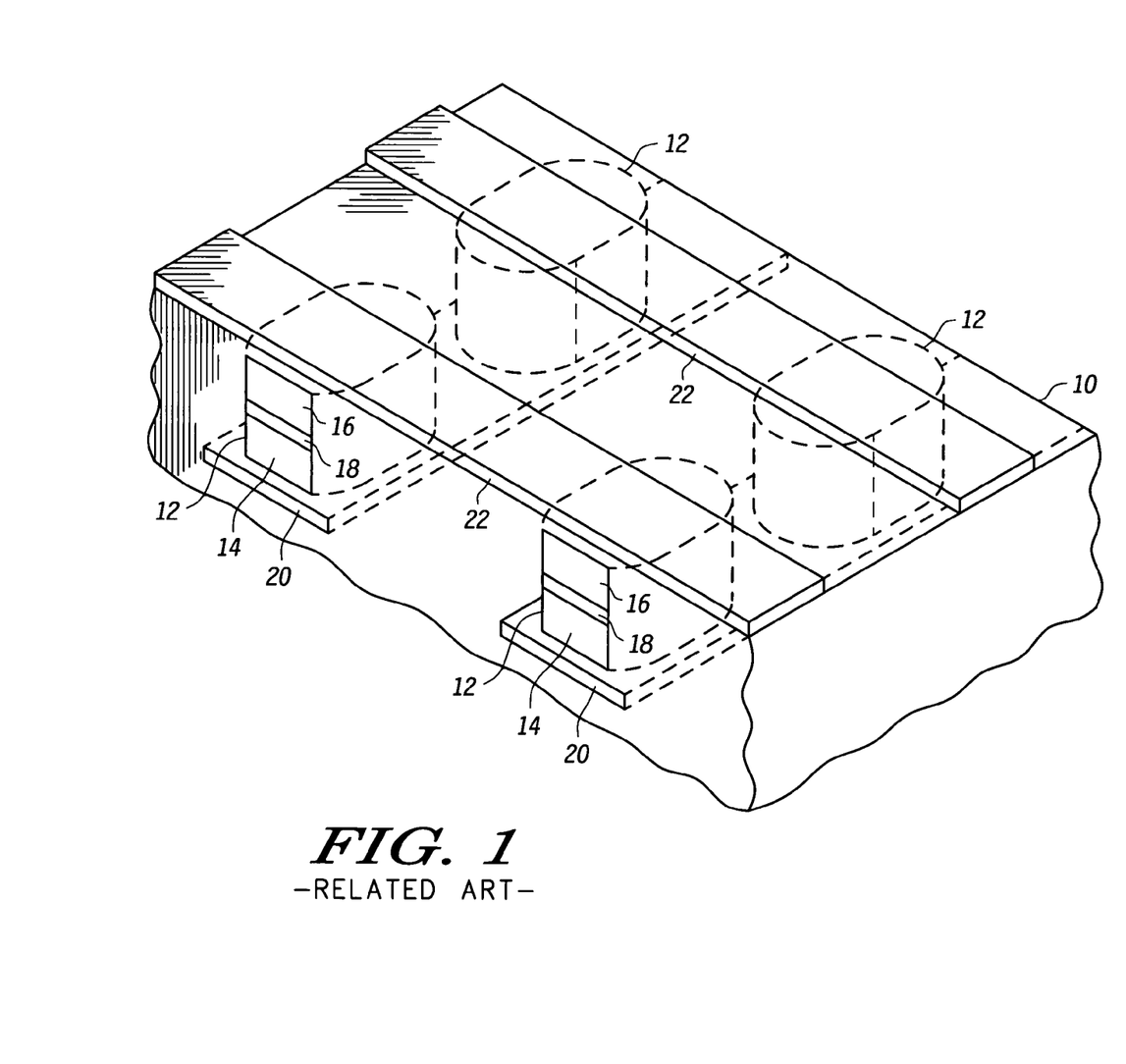
FIG. 1 illustrates a conventional memory element array.

FIG. 1 illustrates a conventional memory element array 10 having one or more memory elements 12. An example of one type of magnetic memory element, a magnetic tunnel junction (MTJ) element, comprises a fixed ferromagnetic layer 14 that has a magnetization direction fixed with respect to an external magnetic field and a free ferromagnetic layer 16 that has a magnetization direction that is free to rotate with the external magnetic field. The fixed layer and free layer are separated by an insulating tunnel barrier layer 18. The resistance of memory element 12 relies upon the phenomenon of spin-polarized electron tunneling through the tunnel barrier layer between the free and fixed ferromagnetic layers. The tunneling phenomenon is electron spin dependent, making the electrical response of the MTJ element a function of the relative orientations and spin polarization of the conduction electrons between the free and fixed ferromagnetic layer.

The memory element array 10 includes conductors 20, also referred to as digit lines 20, extending along rows of memory elements 12 and conductors 22, also referred to as word or bit lines 22, extending along columns of the memory elements 12. A memory element 12 is located at a cross point of a digit line 20 and a bit line 22. The magnetization direction of the free layer 16 of a memory element 12 is switched by supplying currents to digit line 20 and bit line 22. The currents create magnetic fields that switch the magnetization orientation of the selected memory element from parallel to anti-parallel, or vice versa.

Figure 2:
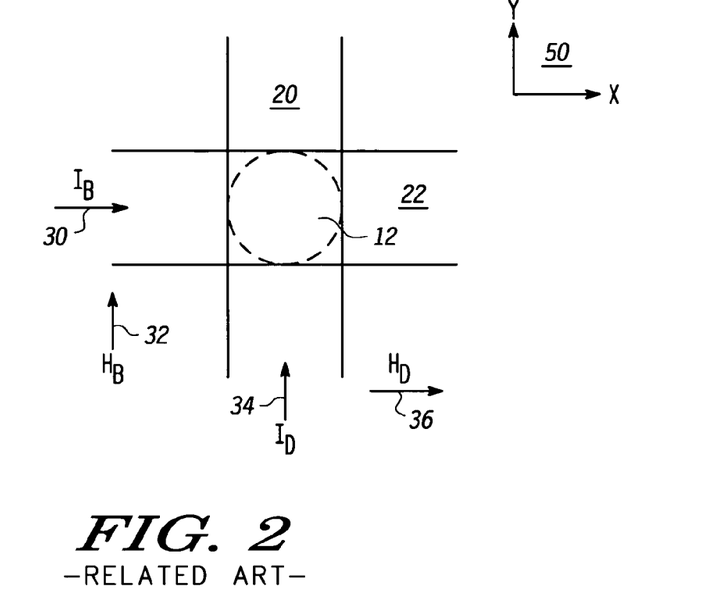
FIG. 2 illustrates magnetic fields generated at a memory element of a conventional memory element array.

FIG. 2 illustrates the fields generated by a conventional linear digit line 20 and bit line 22. To simplify the description of MRAM device 10, all directions will be referenced to an x- and y-coordinate system 50 as shown. A bit current $I_B$ 30 is defined as being positive if flowing in a positive x-direction and a digit current $I_D$ 34 is defined as being positive if flowing in a positive y-direction. A positive bit current $I_B$ 30 passing through bit line 22 results in a circumferential bit magnetic field, $H_B$ 32, and a positive digit current $I_D$ 34 will induce a circumferential digit magnetic field $H_D$ 36. The magnetic fields $H_B$ 32 and $H_D$ 36 combine to switch the magnetic orientation of the memory element 12.

Large bit and digit line currents are undesirable because memory array power consumption is a serious limiting factor in MRAM applications. High bit and digit currents require larger bit and digit lines and write circuits to handle the high currents. This may result in larger, more expensive MRAM devices. However, there is an ever-increasing demand for smaller memory devices. While smaller device size may be achieved through techniques such as patterning smaller memory elements, a smaller memory element increases the shape component of the anisotropy associated with the memory element. As the anisotropy increases, the amount of current necessary to alter the magnetization direction also increases.

Accordingly, it is desirable to provide a low power MRAM memory element that requires reduced or minimized current to alter the magnetic direction of the element. In addition, it is desirable to provide an MRAM device that requires low power for programming. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 3:
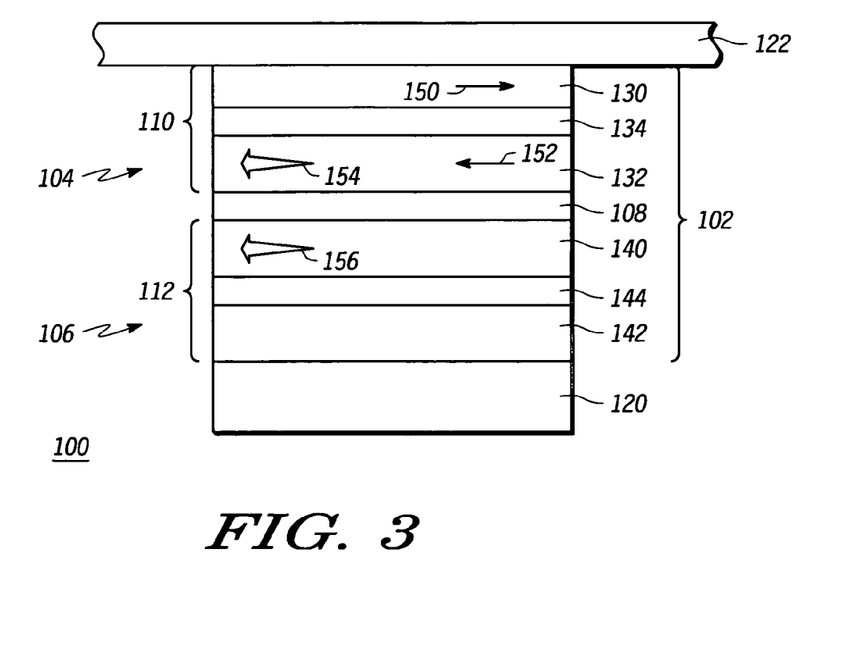
FIG. 3 is a cross-sectional view of a memory element in accordance with an exemplary embodiment of the present invention.

Turning now to FIG. 3, in accordance with an exemplary embodiment of the present invention, a simplified sectional view of an MRAM array 100 comprises a scalable magnetoresistive memory element 102. In this illustration, only a single magnetoresistive memory element 102 is shown for simplicity in describing the embodiments of the present invention, but it will be understood that MRAM array 100 may consist of a number of magnetoresistive memory elements 102.

Magnetoresistive memory element 102 is sandwiched between a bit line 122 and a digit line 120. Bit line 122 and digit line 120 include conductive material such that a current can be passed therethrough. In this illustration, bit line 122 is positioned on top of magnetoresistive memory element 102 and digit line 120 is positioned on the bottom of magnetoresistive memory element 102, and is directed at a 90-degree angle to bit line 122. While bit line 122 and digit line 120 are illustrated with physical contact to memory element 102, it will be understood that the various embodiments of the present invention are not so limited and bit line 122 and/or digit line 120 may be physically separated from memory element 102. In addition, while bit line 122 is illustrated positioned above digit line 120, it will be understood that the reverse positioning of digit line 120 and bit line 122 may be utilized.

Magnetoresistive memory element 102 comprises a first magnetic region 104, a second magnetic region 106, and a tunnel barrier 108 disposed between first magnetic region 104 and second magnetic region 106. In one embodiment of the invention, magnetic region 104 includes a synthetic anti-ferromagnetic (SAF) structure 110, a structure having an anti-ferromagnetic coupling spacer layer 134 sandwiched between two ferromagnetic portions 130 and 132. Further, second magnetic region 106 may have an SAF structure 112, which has an anti-ferromagnetic coupling spacer layer 144 disposed between two ferromagnetic portions 140 and 142. However, it will be appreciated that second magnetic region 106 may have any structure suitable for forming an operable memory element 102.

Ferromagnetic portions 130 and 132 each have a magnetic moment vector 150 and 152, respectively, that are usually held anti-parallel by the anti-ferromagnetic coupling spacer layer 134. Magnetic region 104 has a resultant magnetic moment vector 154 and magnetic region 106 has a resultant magnetic moment vector 156. Resultant magnetic moment vectors 154 and 156 are oriented along an anisotropy easy-axis in a direction that is at an angle with respect to bit line 122 and digit line 120. In a preferred embodiment of the invention, the resultant magnetic moment vectors 154 and 156 are oriented at angle in the range of about 30 degrees to about 60 degrees with respect to bit line 122 and/or digit line 120. In a more preferred embodiment of the invention, the resultant magnetic moment vectors 154 and 156 are oriented at an angle of about 45 degrees from bit line 122 and digit line 120. Further, magnetic region 104 is a free ferromagnetic region, meaning that resultant magnetic moment vector 154 is free to rotate in the presence of an applied magnetic field. Magnetic region 106 is a pinned ferromagnetic region, meaning that resultant magnetic moment vector 156 is not free to rotate in the presence of a moderate applied magnetic field and is used as the reference layer.

The two ferromagnetic portions 130 and 132 can have different thicknesses or material to provide resultant magnetic moment 154 given by $\Delta M = M_2 - M_1$. In a preferred embodiment of the invention, the SAF structure 110 will be substantially balanced; that is, $\Delta M$ is less than 15 percent of the average of $M_2 - M_1$ (otherwise simply stated as "the imbalance is less than 15 percent) and is more preferably as near to zero as can be economically fabricated in production lots.

During fabrication of MRAM array 100, each succeeding layer, discussed in more detail below, is deposited or otherwise formed in sequence and each memory element 102 may be defined by a particular deposition, photolithography processing, etching, etc. using any of the techniques known in the semiconductor industry. During deposition of at least the ferromagnetic portions 130 and 132, a magnetic field is provided to set a preferred anisotropy easy-axis (induced intrinsic anisotropy). The provided magnetic field creates a preferred anisotropy easy-axis for magnetic moment vectors 150 and 152. As described in more detail below, in addition to intrinsic anisotropy, memory elements having aspect ratios (i.e., length divided by width) greater than one may have a shape anisotropy that defines an easy axis that is parallel to a long axis of the memory element. This easy axis may also be selected to be at an angle, preferably about a 30 to 60 degree angle, more preferably at about a 45-degree angle, with respect to the bit line 122 and/or the digit line 120.

Figure 4:
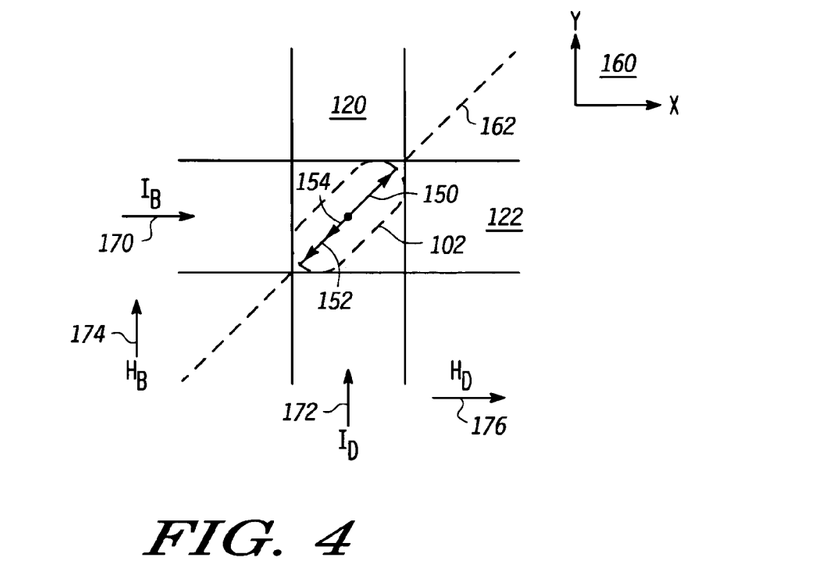
FIG. 4 is a plan view of the memory element of FIG. 3 illustrating magnetic fields generated at the memory element.

FIG. 4 illustrates a simplified plan view of MRAM array 100 in accordance with an embodiment of the present invention. To simplify the description of magnetoresistive memory element 102, all directions will be referenced to an x- and y-coordinate system 160 as shown. To further simplify the description, only the magnetic moment vectors of region 104 are illustrated since they will be switched. As illustrated, resultant magnetic moment vector 154 is oriented along an anisotropy easy axis 162 at an angle 164 with respect to the bit line 122 and the digit line 120. As shown, a bit current $I_B$ 170 is defined as being positive if flowing in a positive x-direction and a digit current $I_D$ 172 is defined as being positive if flowing in a positive y-direction. A positive bit current $I_B$ 170 passing through bit line 122 results in a circumferential bit magnetic field, $H_B$ 174, and a positive digit current $I_D$ 172 will induce a circumferential digit magnetic field $H_D$ 176. The magnetic fields $H_B$ 174 and $H_D$ 176 combine to switch the magnetic orientation of first magnetic region 104 of memory element 102.

Figure 5:
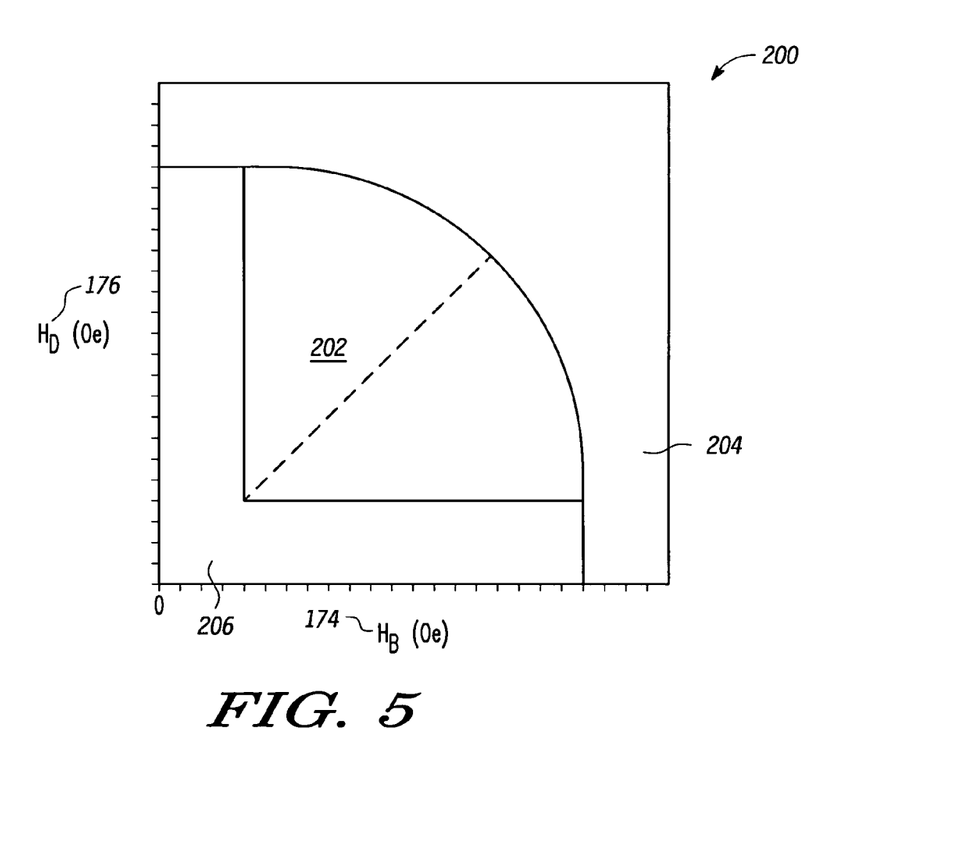
FIG. 5 is a graphical illustration of a programming window of the memory element of FIG. 3.

FIG. 5 is a graphical representation 200 of a programming region or window, in terms of magnetic field $H_B$ 174 and magnetic field $H_D$ 176, within which first magnetic region 104 may be switched reliably. In MRAM array 100, an individual memory element is programmed by flowing current through the bit line and the digit line proximate to the individual memory element. Information is stored by selectively switching the magnetic moment direction of first magnetic region 104 of the individual memory element 102. The memory element state is programmed to a "1" or "0" depending on the previous state of the bit; that is, a "1" is switched to a "0" or a "0" to a "1". All other memory elements 102 exposed only to fields from a single line (½-selected memory elements), or no lines. A memory element is switched reliably when the magnetic region 104 of the memory element switches deterministically between a "0" state and a "1" state upon application or withdrawal of a magnetic field. A memory element that switches somewhat randomly between a "0" state and a "1" state upon application or withdrawal of a magnetic field does not provide reliable or desirable switching.

Due to process and material variations, an array of memory elements 102 has a distribution of switching fields with a mean value ⟨Hsw⟩ and a standard deviation $\sigma_{sw}$. Typically, the array of memory elements 102 is required to meet a predetermined switching or programming error rate. Accordingly, to program the memory elements 102 in MRAM array 100 with approximately the same currents, the applied field produced from the currents preferably is larger than the mean switching field ⟨Hsw⟩ by no less than approximately $N\sigma_{sw}$, where N is a positive number large enough to ensure the actual switching error rate does not exceed the predetermined programming error rate, and is typically greater than or equal to 6 for memories whose size are about 1 Mbit or larger.

In addition, there is a maximum saturation field $H_{SAT}$ that can be applied to a selected memory element to ensure reliable switching. The field $H_{SAT}$ corresponds to that field which, when applied to magnetic region 104, causes magnetic moment vector 150 and 152 to be aligned approximately parallel. Therefore, $H_{SAT}$ is known as the saturation field of the SAF structure in region 104 and is a measure of the anti-ferromagnetic coupling between layers 130 and 132. Also due to process and material variations, an array of memory elements 102 has a distribution of saturation fields with a mean value ⟨$H_{SAT}$⟩ and a standard deviation $\sigma_{sat}$. Therefore, the applied field preferably is kept less than approximately ⟨$H_{SAT}$⟩−$N\sigma_{sat}$ or the selected memory element will not be programmed reliably.

Thus, for reliable programming that meets a predetermined switching error rate or has an error rate below the predetermined switching error rate, there is an operating window 202 for an applied magnetic field H that results from programming fields $H_B$ 174 and $H_D$ 176. The magnitude of the operating window, $H_{win}$, along the dotted line shown in FIG. 5 is represented approximately by the equation $H_{win} \approx$ (⟨Hsat⟩−$N\sigma_{sat}$)−(⟨Hsw⟩+$N\sigma_{sw}$). Inside this window 202, substantially all the memory elements can be programmed without error. Outside this window, the memory elements cannot be programmed or cannot be programmed without possible errors. For example, the region 204 of graphical representation 200 is that region where a magnetic field H applied to memory element 102 by bit current $I_B$ 170 and digit current $I_D$ 172 is greater than $H_{SAT}$ and first magnetic region 104 of magnetoresistive memory element 102 does not switch reliably between both the "1" and "0" states. The region 206 of graphical representation 200 is that region where the applied field H is less than the switching field $H_{SW}$ and first magnetic region 104 of magnetoresistive memory element 102 does not switch.

The magnetic switching field for writing to memory element 102 is represented by the equation:

$$H_{SW} \cong \sqrt{H_k H_{SAT}},$$

where $H_k$ is the total anisotropy of first magnetic region 104 and $H_{SAT}$, as described above, is the anti-ferromagnetic coupling saturation field, that is, $H_{SAT}$ is the maximum magnetic field at which first magnetic region 104 of magnetoresistive memory element 102 will switch reliably. $H_k$ may be represented by the equation:

$$H_k(\text{total}) = H_k(\text{intrinsic}) + H_k(\text{shape}),$$

where $H_k$(intrinsic) is the intrinsic anisotropy of the material comprising magnetic region 104 and $H_k$(shape) is the anisotropy due to the shape of magnetic region 104. Similarly, $H_{SAT}$ may be represented by the equation:

$$H_{SAT}(\text{total}) = H_{SAT}(\text{intrinsic}) + H_{SAT}(\text{shape}).$$

In this equation, $H_{SAT}$(intrinsic) is the magnetic field at which the magnetic layers of first magnetic region 104 are substantially parallel to each other when formed as continuous films and $H_{SAT}$(shape) represents the magnetostatic coupling of the magnetic layers of magnetic region 104 as a result of the shape of the magnetic region 104.

Accordingly, to reduce the power required by magnetoresistive memory element 102, that is, to reduce or minimize the current required to switch first magnetic region 104 of magnetoresistive memory element 102, $H_{SW}$ of magnetic region 104 may be reduced or minimized. To minimize $H_{SW}$, $H_k$(total) or $H_{SAT}$(total) or both may be reduced or minimized. Thus, in accordance with an embodiment of the invention, $H_k$(intrinsic), $H_k$(shape), $H_{SAT}$(intrinsic), or $H_{SAT}$(shape), or any combination thereof, may be reduced or minimized.

Referring again to FIG. 3, in accordance with an exemplary embodiment of the present invention, to reduce or minimize the current required to switch first magnetic region 104, and thus reduce the power required by memory element 102, ferromagnetic portions 130 and 132 may be fabricated such that magnetic region 104 has a low $H_k$(total) value. However, in a preferred embodiment of the invention, magnetic region 104 may not have an $H_k$(total) value that is so low that magnetic region 104 and, hence, magnetoresistive memory element 102, are thermally unstable and volatile. Thermal instability refers to the switching of the memory state due to thermal fluctuations in the magnetic layers 130 and 132. The energy barrier $E_b$ to thermal fluctuations for first magnetic region 104 is represented approximately by the equation $E_b = M_S \times V \times H_k$, where $M_S$ is the saturation magnetization of the magnetic material in layers 130 and 132, V is the total volume (area×thickness) of layers 130 and 132, and $H_k$ is as defined above. In one embodiment of the invention, $H_k$(total) has a value of less than about 15 Oe-microns divided by region width, where the "region width" is the dimension (in microns) of the first magnetic region 104 that is orthogonal to the longitudinal axis of the first magnetic region 104 and the thickness of the first magnetic region 104. In a preferred embodiment of the present invention, $H_k$(total) has a value in the range of from about 10 Oe-microns÷region width (in microns) to about 15 Oe-microns÷region width (in microns).

In one embodiment of the invention, to reduce $H_k$(total) and, hence, to reduce the power requirements of memory element 102, ferromagnetic portions 130 and 132 may be formed of one or more layers of material or materials having a low $H_k$(intrinsic) value. As used herein, the term low $H_k$(intrinsic) value means an $H_k$(intrinsic) value of less than or equal to about 10 Oe. Examples of materials that have a low $H_k$(intrinsic) value that is suitable for forming ferromagnetic portions 130 and 132 of magnetic region 104 but that does not render magnetic region 104 thermally unstable include nickel (Ni), iron (Fe), cobalt (Co), or alloys of Ni, alloys of Fe, or alloys of Co, such as NiFeB, NiFeMb, NiFeTa, NiFeCo, and the like. Ferromagnetic portions 130 and 132 may be formed of the same material or may be formed of different materials having a low $H_k$(intrinsic) value.

In accordance with another embodiment of the present invention, to reduce the power requirements of memory element 102, magnetic region 104 may be fabricated utilizing a material or materials that produce a low $H_k$(shape) value to form ferromagnetic portions 130 and 132. Again, however, it is preferred that the material that forms magnetic region 104 may not produce an $H_k$(total) value that is so low that magnetic region 104 and, hence, magnetoresistive memory element 102, are thermally unstable and volatile. As discussed above, materials producing a low $H_k$(shape) value for a given memory element shape include materials having a low saturation magnetization $M_s$. As used herein, the term "low saturation magnetization", or "low magnetization", refers to those materials having a magnetization that is less than or equal to the magnetization of $Ni_{80}Fe_{20}$. $Ni_{80}Fe_{20}$ has a magnetization approximately equal to 800 kA/m and a saturation flux density of approximately 1 Tesla. As the magnetization of the material(s) that form ferromagnetic portions 130 and 132 also directly affect the magnetostatic coupling of the layers, the use of a low magnetization material(s) for ferromagnetic portions 130 and 132 also serves to reduce or minimize $H_{SAT}$(shape). Accordingly, the lower the magnetization of the material(s) of portions 130 and 132 is, the lower the $H_k$(shape) and the $H_{SAT}$(shape) values are. Low magnetization materials suitable for forming ferromagnetic portions 130 and 132 comprise $Ni_{80}Fe_{20}$ and alloys of Ni, alloys of Fe, or alloys of Co, such as, for example, NiFeB, NiFeMb, NiFeTa, and NiFeCo. Again, ferromagnetic portions 130 and 132 may be formed of the same or different low magnetization materials.

Figure 6:
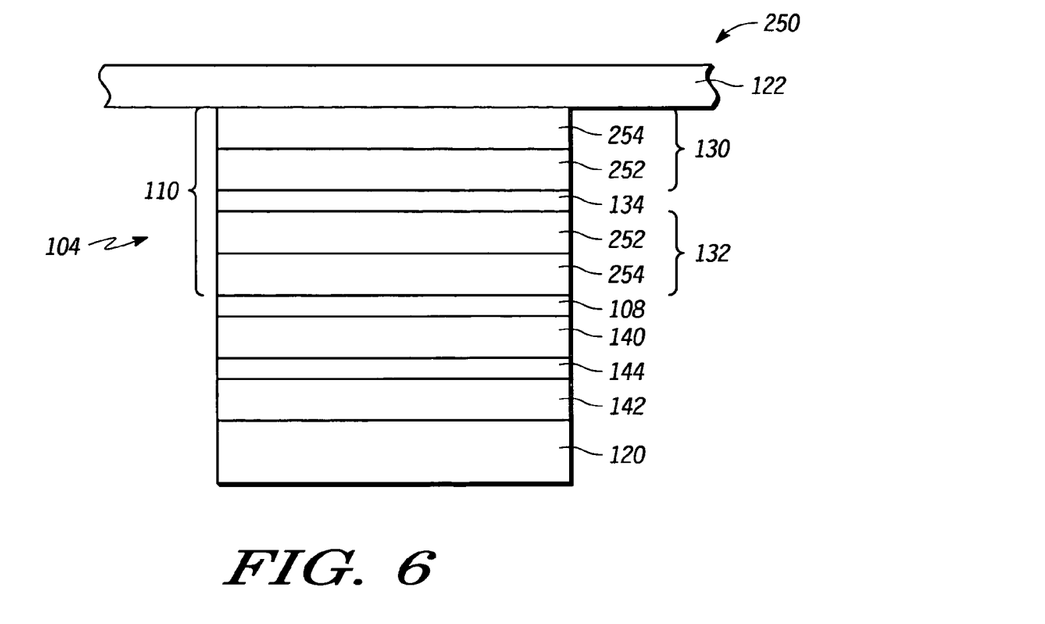
FIG. 6 is a cross-sectional view of a memory element in accordance with another exemplary embodiment of the present invention.

The doping of $Ni_{80}Fe_{20}$ with materials such as molybdenum, tantalum, boron, and the like also may result in a material with a low $H_k$(intrinsic) value and a magnetization less than those of $Ni_{80}Fe_{20}$, thus facilitating fabrication of a low power memory element 102. However, doping with such materials also may decrease the magnetoresistance through tunnel barrier 108, and thus decrease the performance of memory element 102. Although the spin polarization of the tunneling electrons determines the magnetoresistance, low magnetization materials typically also have low spin polarization. Accordingly, in one alternative embodiment of the invention, as illustrated in FIG. 6, a magnetoresistive memory element 250 may have a ferromagnetic portion 132 that comprises two materials, a first material 252 with a low magnetization that reduces the value of $H_k$(shape) of magnetic region 104 and a second material 254, disposed close to the tunnel barrier 108, with a high polarization that compensates for the decrease in the magnetoresistance due to the first material 252. As used herein, the term "high polarization material" is any material having a spin polarization that is greater than or equal to $Ni_{80}Fe_{20}$. Second material 254 may comprise material such as, for example, Co, Fe, and CoFe and may also comprise $Ni_{80}Fe_{20}$ when the first material 252 has a magnetization lower than $Ni_{80}Fe_{20}$. In a preferred embodiment of the invention, first material 252 and/or second material 254 comprise materials that also have a low $H_k$(intrinsic), as described above. As first magnetic region 104 is preferably a moment-balanced SAF structure, in one embodiment of the invention, ferromagnetic portion 130 has a thickness such that the magnetic moments of ferromagnetic portions 132 and 130 have the same magnitude. In another embodiment of the invention, ferromagnetic portion 130 also comprises first material 252 and second material 254.

The Hk(shape) of a single magnetic layer is approximately proportional to $N_d \times M_s \times t/w$ where $N_d$ is a demagnetizing factor that increases with aspect ratio, t is the thickness of the layer, and w is the region width. This formula also applies for the layers in the SAF structure of first magnetic region 104. Although the SAF structure of first magnetic region 104 does reduce Hk(shape) compared to a single film of comparable thickness 2×t, the Hk(shape) is still finite due to asymmetry in the switching process. The magnetic layers are not perfectly antiparallel during switching, so that each layer's magnetostatic fields (that produce Hk(shape)) do not perfectly cancel one another.

In another embodiment of the present invention, magnetic region 104 may be fabricated with the minimum possible thickness t for ferromagnetic layers 130 and 132. As discussed above, a thinner thickness t will result in a smaller Hk(shape) and $H_{SAT}$(shape) since the magnetostatic fields that produce Hk(shape) and $H_{SAT}$(shape) are proportional to thickness. The minimum thickness possible is limited by the requirement of thermal stability. Note that by reducing t, both Hk(shape) and total volume V of layers 130 and 132 are reduced for the bit, so that the energy barrier is reduced by approximately $t^2$. In addition to the thermal stability requirement, the minimum thickness is also limited by the ability to grow a high quality continuous magnetic film on top of the tunnel barrier. In one embodiment of the invention, the optimum minimum thickness t of layers 130 and 132 is within a range of from about 3.5 nm to about 5 nm.

Figure 10:
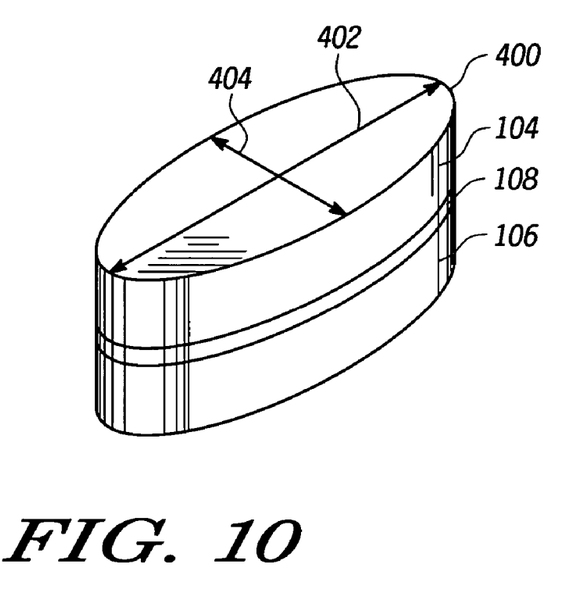
FIG. 10 is a schematic illustration of a memory element having an elliptical shape.
Figure 11:
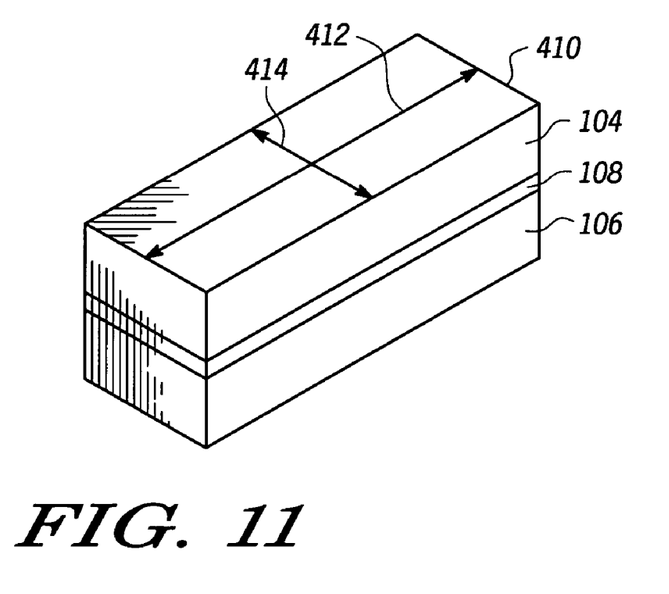
FIG. 11 is a schematic illustration of a memory element having a rectangular shape.

Referring again to FIG. 3, in accordance with a further embodiment of the present invention, to reduce the power requirements of memory element 102, first magnetic region 104 also may be fabricated to have a low $H_k$(shape) value by forming it in a shape having a low aspect ratio. In one embodiment of the invention, first magnetic region 104 has a length preferably measured along a long axis of region 104, and a width measured orthogonal to the length, and a length/width ratio in a range of about 1 to about 3 for a non-circular plan. For example, as illustrated in FIG. 10, in one embodiment of the invention, a memory element 400, which may be the same as memory element 102, may have a first magnetic region 104 of an elliptical shape with a length 402 and width 404 and with a length/width ratio of about 1 to about 3. In another embodiment of the invention, as illustrated in FIG. 11, a memory element 410, which may be the same as memory element 102, may have a first magnetic region 104 of a rectangular shape with a length 412 and width 414 and having a length/width ratio of about 1 to about 3. Alternatively, the first magnetic region 104 of a memory element may be circular in shape (length/width ratio of 1) to minimize the contribution to the switching field from shape anisotropy $H_k$(shape) and also because it is easier to use photolithographic processing to scale the device to smaller dimensions laterally. However, it will be understood that first magnetic region 104 can have any other suitable shape, such as square or diamond. In a preferred embodiment of the invention, first magnetic region 104 has a length/width ratio in a range of about 2 to about 2.5.

In accordance with yet another embodiment of the present invention, magnetic region 104 may be fabricated to reduce or minimize $H_{SAT}$(total) to reduce the power requirements of memory element 102. Again, however, as discussed above with reference to FIG. 5, magnetic region 104 may not have an $H_{SAT}$(total) value that is so low that there is no operable programming window. In other words, while $H_{SAT}$(total)

may be reduced or minimized, its value preferably is such that the programming window operable for switching magnetic region 104 can be defined as above by the equation $H_{win} \approx (\langle H_{SAT}\rangle - N\sigma_{sat}) - (\langle Hsw\rangle + N\sigma_{sw})$, where $H_{win}$ is a magnetic field applied to magnetoresistive memory element 102 by currents $I_D$ and $I_B$ to switch magnetic region 104. In one embodiment of the invention, $H_{SAT}$(total) has a value in the range of from about 150 Oe to about 350 Oe. In a preferred embodiment, $H_{SAT}$(total) has a value less than or equal to approximately $180/w^{0.5}$ (Oe), where w is the region width of magnetic region 104, as previously described.

Figure 7:
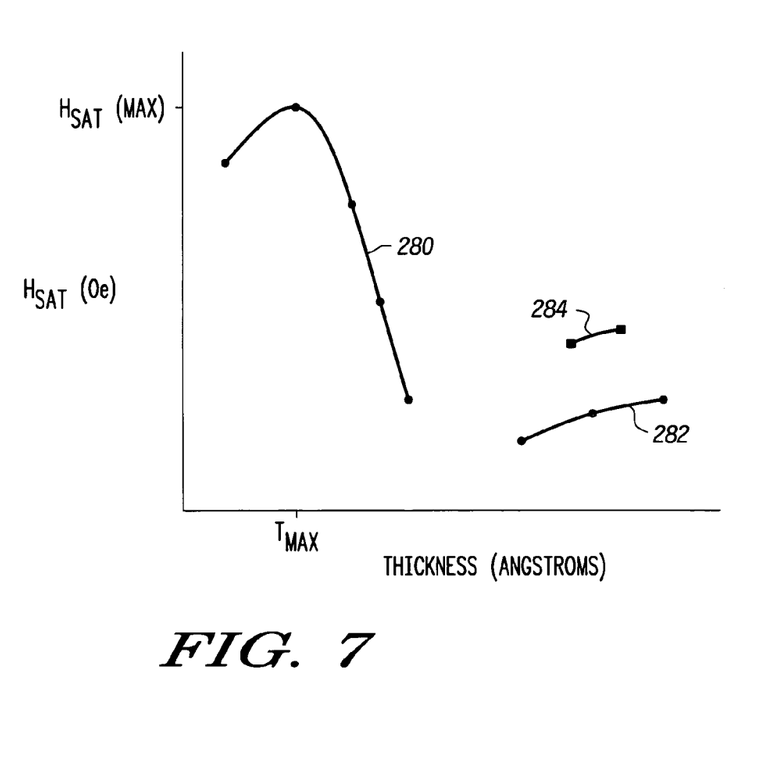
FIG. 7 is a graphical illustration of the relationship between an anti-ferromagnetic coupling saturation field of an anti-ferromagnetic coupling material and the thickness of the anti-ferromagnetic coupling material.

At present memory element dimensions in the range of 0.5 to 1 micron, the dominant contribution to $H_{SAT}$(total) is from $H_{SAT}$(intrinsic). $H_{SAT}$(intrinsic) is determined by the anti-ferromagnetic coupling material that comprise anti-ferromagnetic coupling spacer layer 134 and its thickness. Generally, anti-ferromagnetic coupling spacer layer 134 comprises one of the elements ruthenium, osmium, rhenium, chromium, rhodium, copper, or combinations thereof. Preferably, anti-ferromagnetic coupling spacer layer 134 comprises ruthenium. In one embodiment of the present invention, $H_{SAT}$(intrinsic), and hence $H_{SAT}$(total), may be reduced or minimized by fabricating anti-ferromagnetic coupling spacer layer 134 with a thickness such that magnetic region 104 comprises a second order SAF. FIG. 7 is a graph that illustrates a typical relationship between the value of $H_{SAT}$ (intrinsic) and the thickness of an anti-ferromagnetic coupling material, such as ruthenium, that may be used to form anti-ferromagnetic coupling spacer layer 134. As shown in FIG. 7, the anti-ferromagnetic coupling material operates as an anti-ferromagnetic coupling spacer layer 134 at a first peak or first range of thicknesses 280. At first peak 280, the anti-ferromagnetic coupling spacer layer 134 forms a first order SAF with ferromagnetic layers 130 and 132 of FIG. 3. The anti-ferromagnetic coupling material also may operate as an anti-ferromagnetic coupling spacer layer 134 at a second peak or range of thicknesses 282, thus forming a second order SAF with ferromagnetic layers 130 and 132. As illustrated in FIG. 7, the values of $H_{SAT}$(intrinsic) are relatively higher at the first peak 280 than at the second peak 282. Thus, by forming magnetic region 104 as a second order SAF, that is, with an anti-ferromagnetic coupling spacer layer 134 having a thickness within the range of thicknesses of the second peak 282, $H_{SAT}$(total) may be reduced or minimized, thus reducing or minimizing $H_{SW}$. In addition, the second peak is much flatter as a function of spacer layer thickness compared to the first order peak, so that the spacer layer thickness can vary over a wider range and still supply an $H_{SAT}$(intrinsic) of nominally the same magnitude. $H_{SAT}$ insensitivity to spacer layer thickness may be desirable for robust and reproducible manufacturing.

As described above, while it is preferable that $H_{SAT}$(total) be minimized to lower the power requirements of magnetoresistive memory element 102, $H_{SAT}$(total) preferably is large enough that there exists an operable programming window for programming memory element 102. Thus, while it may be desirable to fabricate magnetic region 104 as a second order SAF, $H_{SAT}$(total) may be too low to provide a satisfactory programming window for memory element 102. As illustrated by a third peak 284 in FIG. 7, the presence of a material that produces higher anti-ferromagnetic exchange coupling, such as a material comprising Co, Fe, or CoFe, disposed proximate to a surface of anti-ferromagnetic coupling spacer layer 134 may increase $H_{SAT}$(intrinsic) to acceptable values. Accordingly, referring to FIG. 8, in another embodiment of the present invention, a magnetoresistive memory element 300 may comprise a first interface layer 302 disposed at a first surface of anti-ferromagnetic coupling spacer layer 134 and/or a second interface layer 304 disposed at a second surface of anti-ferromagnetic coupling spacer layer 134. Materials suitable for forming interface layers 302 and 304 comprise materials such as Co, Fe, CoFe, and alloys of Co or alloys of Fe, such as, for example, CoFeTa or CoFeB.

Referring again to FIG. 7, in another embodiment of the invention, magnetic region 104 may be fabricated as a first order SAF, that is, with an anti-ferromagnetic coupling spacer layer 134 having a thickness within the range of thicknesses of the first peak 280. Preferably, however, anti-ferromagnetic coupling spacer layer 134 has a thickness that is larger than a thickness $t_{max}$ that results in a maximum $H_{SAT}$(intrinsic). In this regard, $H_{SAT}$(intrinsic) may be optimized along first peak 280 to reduce the power requirements of memory element 102 but also to provide a suitable programming window within which memory element 102 may be switched.

Figure 8:
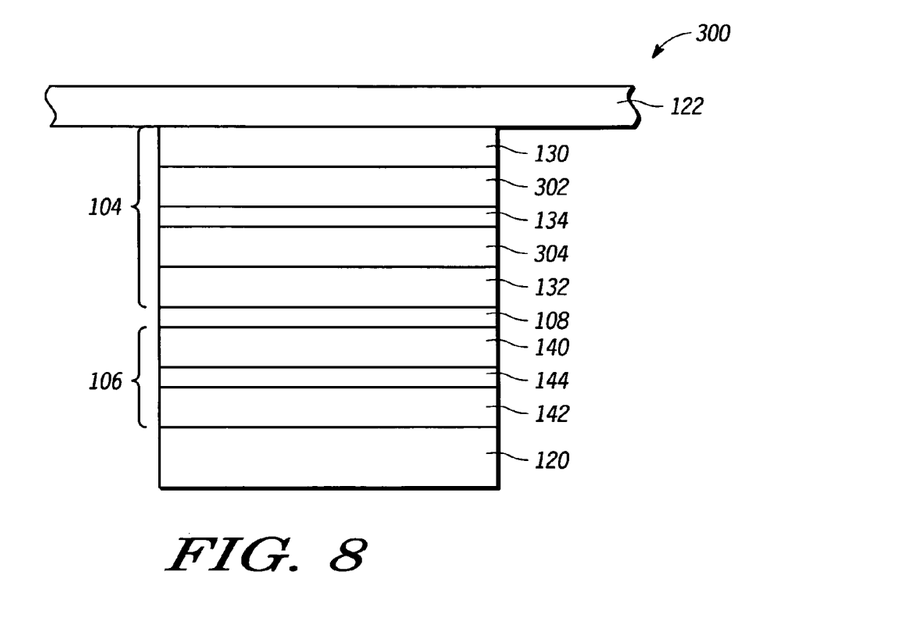
FIG. 8 is a cross-sectional view of a memory element in accordance with a further exemplary embodiment of the present invention.

In yet another embodiment of the invention, when magnetic region 104 is fabricated as a first order SAF, $H_{SAT}$ (intrinsic) may be further optimized by utilizing interface layers 302 and/or 304, as illustrated in FIG. 8. For practical reasons, it may be desirable to fabricate magnetic region 104 with an anti-ferromagnetic coupling spacer layer thickness that exhibits an $H_{SAT}$(intrinsic) that is approximately equal to or below a predetermined $H_{SAT}$(intrinsic). For example, it may be desirable to form the anti-ferromagnetic coupling spacer layer with a thickness such that any deviations of thickness during processing do not significantly affect the value of $H_{SAT}$(intrinsic). In other words, it may be desirable to form the anti-ferromagnetic coupling spacer layer with a thickness that is at a flatter or more stable region of the first peak 280. However, at this thickness, $H_{SAT}$(intrinsic) may be below a desired $H_{SAT}$(intrinsic). Thus, interface layers 302 and/or 304, as illustrated in FIG. 8, may be utilized to increase the $H_{SAT}$(intrinsic) to the desired value.

Figure 9:
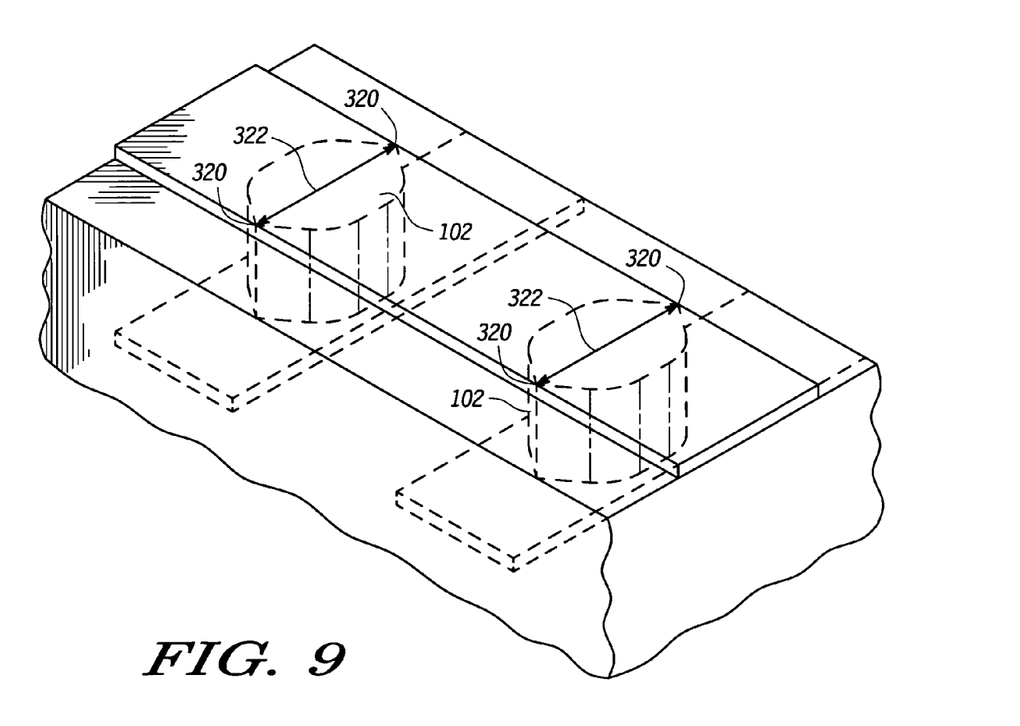
FIG. 9 is a schematic illustration of a memory element array having memory elements, shown in phantom, in accordance with an exemplary embodiment of the present invention.

$H_{SW}$ also may be reduced or minimized, thus reducing the power requirements of memory element 102, by reducing or minimizing $H_{SAT}$(shape). As described above, in one embodiment of the present invention, $H_{SAT}$(shape) may be reduced or minimized by fabricating magnetic layers 130 and 132 from a low magnetization material. Also as described above, in another embodiment of the present invention, $H_{SAT}$(shape) may be reduced or minimized by fabricating magnetic layers 130 and 132 with a minimum thickness t. In another exemplary embodiment of the present invention, $H_{SAT}$(shape) also may be reduced by fabricating memory element 102 with a shape having one or more substantially sharp or pointed ends along the anisotropy axis that exhibit magnetostatic coupling of ferromagnetic layers 130 and 132 that is lower than the magnetostatic coupling of layers 130 and 132 of a memory element 102 having a shape with substantially rounded ends, such as a circular-shaped memory element 102. For example, as illustrated in FIG. 9, memory element 102 may be formed in the shape of an ellipse that comprises substantially sharp or pointed ends 320 along a longitudinal axis 322 of the memory element. A memory element 102 having this shape will exhibit less magnetostatic coupling, and hence a lower $H_{SAT}$(shape) value, than a comparable memory element 102 having a circular shape or an elliptical shape with substantially rounded ends. It will be appreciated, however, that memory element 102 may be fabricated with a variety of other shapes, such as a diamond shape, that will exhibit reduced magnetostatic coupling and hence a reduced or minimized $H_{SAT}$(shape).

Accordingly, magnetoresistive random access memory elements that require lower power for programming in accordance with the present invention have been described. The power requirements for programming the memory elements are related to the magnetic switching field $H_{sw}$ represented by the equation $H_{SW} \cong \sqrt{H_k H_{SAT}}$. The embodiments of the present invention provide methods and structures for reducing and/or minimizing $H_k$ and $H_{SAT}$. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A method for fabricating a magnetoelectronics memory element, the method comprising:
   depositing a fixed magnetic portion overlying a digit line;
   forming a tunnel barrier portion overlying said fixed magnetic portion;
   depositing a first magnetic portion overlying said tunnel barrier portion, said first magnetic portion comprising a material having a magnetization that is no greater than a magnetization of $Ni_{80}Fe_{20}$;
   forming an anti-ferromagnetic coupling layer overlying said first magnetic portion; and
   depositing a second magnetic portion overlying said anti-ferromagnetic coupling spacer layer, said second magnetic portion comprising a material having a magnetic moment that is no greater than a magnetization of $Ni_{80}Fe_{20}$; and
   forming a bit line overlying said second magnetic portion;
   wherein said first magnetic portion, said anti-ferromagnetic coupling layer, and said second magnetic portion form a free SAF structure and wherein said first magnetic portion and said second magnetic portion are formed such that said free SAF structure is substantially balanced and has a resultant magnetic moment oriented at an angle with respect to said digit line and said bit line.

2. The method for fabricating a magnetoelectronics memory element of claim 1, wherein said first magnetic portion and said second moment portion each are formed of a material selected from the group consisting of Ni, Fe, Co, alloys of Ni, alloys of Fe, and alloys of Co.

3. The method for fabricating a magnetoelectronic memory element of claim 2, wherein the step of depositing a first magnetic portion comprises the step of depositing a first magnetic portion comprising at least one material selected from the group consisting of molybdenum, tantalum, and boron.

4. The method for fabricating a magnetoelectronic memory element of claim 2, wherein the step of depositing a second magnetic portion comprises the step of depositing a second magnetic portion comprising at least one material selected from the group consisting of molybdenum, tantalum, and boron.

5. The method for fabricating a magnetoelectronics memory element of claim 1, the step of depositing a first magnetic portion further comprising the step of depositing a first material layer overlying said tunnel barrier portion, said first material layer comprising a material having spin polarization that is greater than a spin polarization of said first magnetic portion.

6. The method for fabricating a magnetoelectronics memory element of claim 5, the step of depositing a second magnetic portion further comprising the step of depositing a second material layer, said second material layer comprising a material having a magnetic moment such that said free SAF structure is substantially moment-balanced.

7. A method for fabricating a magnetoelectronic memory element, the method comprising:
   depositing a fixed magnetic portion overlying a digit line;
   forming a tunnel barrier portion overlying said fixed magnetic portion;
   forming a first magnetic portion overlying said tunnel barrier portion;
   depositing an anti-ferromagnetic coupling spacer layer overlying said first magnetic portion;
   forming a second magnetic portion overlying said anti-ferromagnetic coupling spacer layer, and
   forming a bit line overlying said second magnetic portion;
   wherein said first magnetic portion, said anti-ferromagnetic coupling spacer layer, and said second magnetic portion comprise a free SAF structure and wherein the anti-ferromagnetic coupling spacer layer is deposited to a thickness such that said free SAF structure is a second order SAF structure; and wherein said first magnetic portion and said second magnetic portion are formed such that said free SAF structure is substantially balanced and has a resultant magnetic moment oriented at an angle with respect to said digit line and said bit line.

8. The method for fabricating a magnetoelectronic memory element of claim 7, wherein the step of depositing an anti-ferromagnetic coupling spacer layer comprises depositing at least one material selected from the group consisting of ruthenium, osmium, rhenium, chromium, rhodium, and copper.

9. The method for fabricating a magnetoelectronic memory element of claim 7, further comprising the step of forming a first interface layer proximate to a first surface of said anti-ferromagnetic coupling spacer layer, said first interface layer comprising at least one material selected from the group consisting of Co, Fe, alloys of Co, and alloys of Fe.

10. The method for fabricating a magnetoelectronic memory element of claim 9, further comprising the step of forming a second interface layer proximate to a second surface of said anti-ferromagnetic coupling spacer layer, said second interface layer comprising at least one material selected from the group consisting of Co, Fe, alloys of Co, and alloys of Fe.

11. A method for fabricating a magnetoelectronic memory element, the method comprising:
   depositing a fixed magnetic portion overlying a digit line;
   forming a tunnel barrier portion overlying said fixed magnetic portion;
   forming a first magnetic portion overlying said tunnel barrier portion;
   depositing an anti-ferromagnetic coupling spacer layer overlying said first magnetic portion, the anti-ferromagnetic coupling spacer layer formed of an anti-ferromagnetic coupling material comprising at least one material selected from the group consisting of ruthenium, osmium, rhenium, chromium, rhodium, and copper; and forming a second magnetic portion overlying said anti-ferromagnetic coupling spacer layer, wherein said first magnetic portion, said anti-ferromagnetic portion, and said second magnetic portion form a free SAF structure, wherein the anti-ferromagnetic coupling spacer layer is deposited to a thickness such that said free SAF structure is a first order SAF structure and wherein said thickness is greater than a thickness at which an anti-ferromagnetic coupling saturation field $H_{SAT}$ of said anti-ferromagnetic coupling material is a maximum.

12. The method for fabricating a magnetoelectronic memory element of claim 11, further comprising the step of forming a first interface layer proximate to a first surface of said anti-ferromagnetic coupling spacer layer, said first interface layer comprising at least one material selected from the group consisting of Co, Fe, alloys of Co, and alloys of Fe.

13. The method for fabricating a magnetoelectronic memory element of claim 12, further comprising the step of forming a second interface layer proximate to a second surface of said anti-ferromagnetic coupling spacer layer, said second interface layer comprising at least one material selected from the group consisting of Co, Fe, alloys of Co, and alloys of Fe.

14. A method for fabricating a magnetoresistive random access memory device comprising:

forming an array of memory elements, each memory element comprising a free SAF structure such that the array of memory elements is configured to have a finite magnetic field programming window $H_{win}$ represented by the equation $H_{win} \approx (\langle Hsat \rangle - N\sigma_{sat}) - (\langle Hsw \rangle + N\sigma_{sw})$;

wherein:

⟨Hsw⟩ is a mean switching field for said array;

⟨Hsat⟩ is a mean saturation field for said array;

Hsw for said each memory element is represented by the equation $H_{SW} \approx \sqrt{H_k H_{SAT}}$, wherein $H_k$ represents a total anisotropy field of said free SAF structure of said each memory element and $H_{SAT}$ represents a total anti-ferromagnetic coupling saturation field for said free SAF structure of said each memory element;

N is an integer greater than or equal to 1;

$\sigma_{sw}$ is a standard deviation for ⟨Hsw⟩; and $\sigma_{sat}$ is a standard deviation for ⟨$H_{SAT}$⟩, and selecting $H_k$, $H_{SAT}$, and N values for said free SAF structure of said each memory element so that said array is a thermally stable array that operates at a current that is below a predetermined current value.

* * * * *